United States Patent [19]

Kalter et al.

[11] 4,363,110

[45] Dec. 7, 1982

[54] NON-VOLATILE DYNAMIC RAM CELL

[75] Inventors: Howard L. Kalter, Colchester; Harish N. Kotecha, Essex Junction, both of Vt.; Parsotam T. Patel, Round Rock, Tex.

[73] Assignee: International Business Machines Corp., Armonk, N.Y.

[21] Appl. No.: 219,285

[22] Filed: Dec. 22, 1980

[51] Int. Cl.$^3$ .................. G11C 11/24; G11C 11/34
[52] U.S. Cl. .................... 365/149; 365/228; 365/222; 365/182; 365/185
[58] Field of Search ............ 365/149, 185, 189, 222, 365/228, 177, 182; 307/238.8, 575, 584, 304, 246; 357/41, 23 C, 23 TF, 51

[56] References Cited

U.S. PATENT DOCUMENTS

| | | | |
|---|---|---|---|
| 3,387,286 | 6/1968 | Dennard | 340/173 |
| 3,676,717 | 7/1972 | Lockwood | 307/304 |
| 3,811,076 | 5/1974 | Smith, Jr. | 317/235 |
| 3,900,747 | 8/1975 | Yamazaki et al. | 307/304 |
| 3,916,390 | 10/1975 | Chang et al. | 340/173 |
| 4,055,837 | 10/1977 | Stein et al. | 340/173 |
| 4,064,492 | 12/1977 | Schuermeyer et al. | 365/222 |
| 4,175,291 | 11/1979 | Spence | 365/184 |
| 4,207,615 | 6/1980 | Mar | 365/95 |

OTHER PUBLICATIONS

D. J. DiMaria et al, "High Current Injection Into SiO$_2$ from Si . . . ", J. Appl. Phys., 51(5), May 1980, pp. 2722–2734.

D. J. DiMaria et al, "Electrically-Alterable Memory Using A . . . ", IEEE Electron Device Letters, vol. EDL-1, No. 9, Sep. 1980, pp. 179–181.

Primary Examiner—John C. Martin
Attorney, Agent, or Firm—Stephen J. Limanek

[57] ABSTRACT

This invention provides improved non-volatile semiconductor memories which include a one device dynamic volatile memory circuit having a storage capacitor with a plate and a storage node coupled to a non-volatile device having a floating gate, a control gate and a voltage divider having first and second serially-connected capacitors, with the floating gate being disposed at the common point between the first and second capacitors. The plate of the storage capacitor is connected to a reference voltage source. The control gate is preferably capacitively coupled to the floating gate through the first capacitor which includesa dual charge or electron injector structure. The capacitance of the first capacitor has a value substantially less than that of the second capacitor.

21 Claims, 6 Drawing Figures

NON-VOLATILE DYNAMIC RAM CELL

DESCRIPTION

1. Technical Field

This invention relates to non-volatile semiconductor memory cells and more particularly to cells which utilize a device having a floating gate and, preferably, an enhanced conduction insulator.

2. Background Art

A number of circuits have evolved which take advantage of the ability of field effect transistors to store charge and thus serve as memory cells. Such cells may be either dynamic or static in nature. The dynamic cells may employ only a single field effect transistor and the static cells may be arranged in a flip-flop configuration, as is well known. Each of these types of cells may be referred to as volatile cells since information stored in these cells is lost when the power supply voltage applied to the memory is lost or turned off. In instances where stored volatile information must be retained, an alternate power supply, such as a battery system, must be coupled to the memory for use in the event of failure of the main power supply.

Known devices capable of providing variable threshold voltages, such as field effect transistors having metal-nitride-oxide-silicon (MNOS) and field effect transistors having a floating gate are capable of storing information in a non-volatile manner for long periods of time. By incorporating such non-volatile devices into memory cells, there has been provided normally operating volatile cells which do not require a backup or alternate power supply for preserving information when power interruption or failure occurs in the main power supply.

The non-volatile memory cells which use non-volatile MNOS transistors or devices are capable of retaining for long periods of time information stored volatilely in a cell but these devices require high voltage pulses for writing and erasing the information, they are slow and they require rather complex processes for their fabrication. An example of a non-volatile semiconductor memory cell is taught in U.S. Pat. No. 3,676,717, filed Nov. 2, 1970.

Known non-volatile memory cells which use conventionally arranged floating gate devices are also capable of preserving for long periods of time information stored volatilely in a cell but these devices likewise have required high voltage pulses for writing and erasing the information, they have been slow and required high currents, approximately one milliampere per device, to write. An example of a known non-volatile semiconductor memory cell having incorporated therein a floating gate is taught in U.S. Pat. No. 4,207,615, filed Nov. 17, 1978.

In commonly assigned U.S. patent application Ser. No. 192,579, filed on Sept. 30, 1980 by C. L. Bertin, H. N. Kotecha and F. W. Wiedman, there is disclosed non-volatile static memories which include a volatile circuit coupled to a non-volatile device having a floating gate and first and second control gates capacitively coupled to the floating gate with a charge injector structure including enhanced conduction insulators disposed between the floating gate and one of the two control gates. A detailed discussion of enhanced conduction insulators may be found in an article entitled "High Current Injection Into $SiO_2$ from Si rich $SiO_2$ Films and Experimental Applications" by D. J. DiMaria and D. W. Dong, Journal of Applied Physics 51(5), May 1980, pp. 2722–2735, and a basic memory cell which utilizes the dual electron injector structure is taught in an article entitled "Electrically-Alterable Memory Using A Dual Electron Injector Structure" by D. J. DiMaria, K. M. DeMeyer and D. W. Dong, IEEE Electron Device Letters, Vol. EDL-1, No. 9, September 1980, pp. 179–181.

Highly dense dynamic random access memory (RAM) cells having only a single storage capacitor and a single switch or transistor are disclosed in commonly assigned U.S. Pat. Nos. 3,387,286, filed on July 14, 1967, by R. H. Dennard and 3,811,076, filed on Jan. 2, 1973, by W. M. Smith.

One device dynamic volatile memory cells having the capability of storing data non-volatilely are known. For example, commonly assigned U.S. Pat. No. 3,916,390, filed Dec. 31, 1974, by J. J. Chang and R. A. Kenyon discloses the use of a dual insulator made of silicon dioxide and silicon nitride for storing information non-volatilely during power failure. Other examples of dynamic cells capable of storing non-volatilely by using MNOS structures include U.S. Pat. No. 4,055,837, filed Oct. 22, 1975, by K. U. Stein et al and 4,175,291, filed Oct. 31, 1977, by W. Spence. These dynamic cells having non-volatile capability can operate satisfactorily, however, they generally require both negative and positive voltages to switch between volatile and non-volatile modes, larger cell areas, larger voltages for the volatile operating mode or a backup memory.

DISCLOSURE OF THE INVENTION

It is an object of this invention to provide an improved non-volatile dynamic semiconductor memory which is dense and more versatile than such known memories and which is fabricated by a simple process.

It is another object of this invention to provide an improved non-volatile dynamic semiconductor memory which operates at lower voltages in the volatile mode and requires less power during data transfer between volatile and non-volatile modes.

It is yet another object of this invention to provide an improved non-volatile dynamic semiconductor memory, preferably using an enhanced conduction or silicon-rich insulator, which operates faster than known non-volatile memories.

It is still another object of this invention to provide a dynamic memory system that can store non-volatilely the previously stored data and also can store any new data in a volatile mode, thereby effectively yielding a double dense memory system.

It is a further object of this invention to provide a non-volatile memory system where all volatile data from all cells is preferably transferred to a non-volatile mode in a parallel operation or in one cycle of operation.

It is yet a further object of this invention to provide a non-volatile memory system where both erasure of non-volatile memory and restoration of volatile data occurs simultaneously for all cells of the system.

In accordance with the teachings of this invention improved non-volatile semicondutor memories are provided which include a one device dynamic volatile memory circuit having a storage capacitor with a plate and a storage node coupled to a non-volatile device having a floating gate, a control gate and a voltage divider having first and second serially-connected capacitors, with the floating gate being disposed at the common point between the first and second capacitors. The plate of the storage capacitor is connected to a reference voltage source. The control gate is preferably capacitively coupled to the floating gate through the first capacitor which includes a dual charge or electron injector structure. The capacitance of the first capacitor has a value substantially less than that of the second capacitor.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
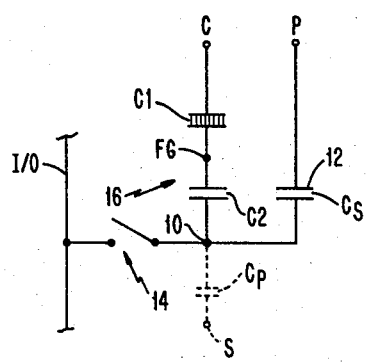
FIG. 1 is a circuit diagram of the non-volatile memory cell of the present invention.

Referring to FIG. 1 of the drawings in more detail, there is shown the circuit diagram of the non-volatile dynamic memory cell of the present invention. This cell includes a storage capacitor $C_S$, and an input/output line I/O which may be interconnect by a switching device 14, preferably a field effect transistor. A voltage $V_P$ is applied to terminal P connected to capacitor plate 12 voltage divider circuit 16 having serially-connected first and second capacitors C1 and C2, respectively, is connected beween the storage node 10 and a terminal C having control voltage $V_C$ applied thereto. A floating gate, identified by terminal FG, is disposed between the first and second capacitors C1 and C2. A parasitic capacitor $C_P$ which is generally present is indicated as being located between the storage node 10 and a semiconductor substrate indicated at S. The first capacitor C1 is preferably a dual charge or electron injector structure of the type described in the hereinabove cited IEEE Electron Device Letters article.

In the normal operation of the circuit or cell of FIG. 1 of the drawings, the storage capacitor $C_s$, the input/output line I/O and the switching device 14 function as a volatile dynamic one device memory cell. When power failure is detected, the storage capacitor plate 12 has applied thereto an appropriate positive voltage through terminal P and the voltage at terminal C is at zero volts. As a result of this pulse, a voltage is developed across the first capacitor C1, if the voltage on the storage node 10 is at +5.0 volts representing a binary bit "1", the voltage across the capacitor C1 is of sufficient value charge the floating gate FG in a positive direction. On the other hand, if the voltage on storage node 10 is at zero volts, representing a binary bit "0", no charge transfer takes place. In this manner, the data from node 10 is stored in a non-volatile mode in the floating gate FG. To retrieve the data from the floating gate FG, first the storage node 10 and all storage nodes of an array are set to zero volts. Next, the control terminal C has applied thereto a pulse having an appropriate positive voltage so that a voltage appears across the first capacitor C1. If the floating gate FG is negatively charged when the positive voltage is applied to the control terminal C, then there is sufficient voltage across the first capacitor C1 to discharge the floating gate FG. As a result, the voltage on the storage node 10 assumes a higher value, e.g., +2.0 volts due to charge induction. If no charge resides on the floating gate FG, no significant charge transfer takes place through the first capacitor C1, and hence the voltage on the storage node 10 remains at zero volts. The cell is next refreshed as a normal volatile cell, and is now available for normal volatile operation.

Since a non-volatile write operation, i.e., charge transfer, occurs only when the voltage on the storage node 10 is at a high value, representing a "1" bit of binary information, the second capacitor C2 should have a very much larger capacitance than the first capacitor C1. This arrangement ensures that most of the voltage appearing on the storage node 10 is capacitively coupled to the floating gate FG. As a result, a large differential voltage is provided which readily distinguishes between a binary bit "1" and a "0". The voltage boost required to produce the necessary voltage across the first capacitor C1 to discharge the floating gate FG is provided essentially by the voltage pulse applied to the storage capacitor plate 12. Consequently, a large fraction of the applied voltage on the storage plate 12 must be capacitively coupled to the floating gate FG. To meet this requirement, it is essential that the total capacitance between the storage plate 12 and the floating gate FG is large compared to capacitance of the first capacitor C1.

The size of the first capacitor C1 is a trade-off between non-volatile write/erase including data retrieval times, applied voltage and process tolerances.

After the binary "1" data has been stored non-volatilely, data retrieval occurs due to charge removal from the floating gate FG which results in increasing the voltage on the storage node 10 by capacitive coupling. In order to obtain maximum signal of the storage node 10, capacitor C2 has to be sufficiently large compared to capacitor $C_s$ and any inherent parasitic capacitance from the storage node 10 to the substrate S. Since the extra voltage boost needed to discharge the floating gate FG is obtained by pulsing the control gate, it is necessary that the capacitor C1 be small compared to the total capacitance from the floating gate FG to the substrate S and storage plate 12.

A further requirement is that the total capacitance at the storage node 10 be sufficiently large compared to the total capacitance of the input/output or bit line I/O when a large number of such cells are used in an array so that the voltages representing the binary bits "0" and "1" can be distinguished by a sense amplifier connected to the bit line I/O.

One preferred cell design includes capacitors having the following nominal values: the first capacitor C1=20 femto farads (fF), where 1 fF is equal to $10^{-15}$ farads, the second capacitor C2=84 fF, the storage capacitor $C_s$=84 fF, the parasitic capacitor $C_P$=28 fF and the total capacitance of the storage node $C_{10}$=120 fF.

Figure 2:
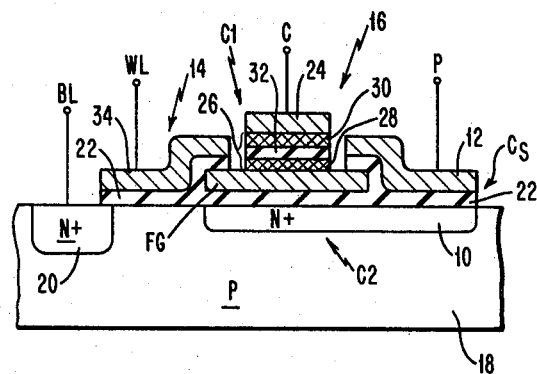
FIG. 2 is a sectional view of an embodiment of the circuit of the present invention illustrated in FIG. 1 of the drawing.

An embodiment of the circuit or cell of the present invention is illustrated in a sectional view in FIG. 2 of the drawings. A P-type silicon substrate 18 has a first N+ diffusion region forming the storage node 10 and a second N+ diffusion region 20 forming the input/output or bit/sense line connected to terminal BL. The floating gate FG is separated from the storage node 10 by a thin insulating layer 22 preferably made of silicon dioxide forming the second capacitor C2. The capacitor C1 is formed by the floating gate FG and a first capacitor electrode 24, connected to control terminal C, along with a dual electron injection structure 26 which includes first and second silicon-rich silicon dioxide layers 28 and 30, respectively, separated by a silicon dioxide layer 32. The storage capacitor $C_s$ is formed by the capacitor plate 12, an end of which overlaps the floating gate FG, the storage node 10 and the silicon dioxide layer 22. The switching device or transistor 14 is formed by a gate electrode 34, having an end overlapping the floating gate FG, disposed between the bit/sense line diffusion region 20 and the storage node diffusion region 10 and separated from the surface of the silicon substrate 18 by the silicon dioxide layer 22. The gate electrode 34 is connected to a word line terminal WL.

Figure 3:
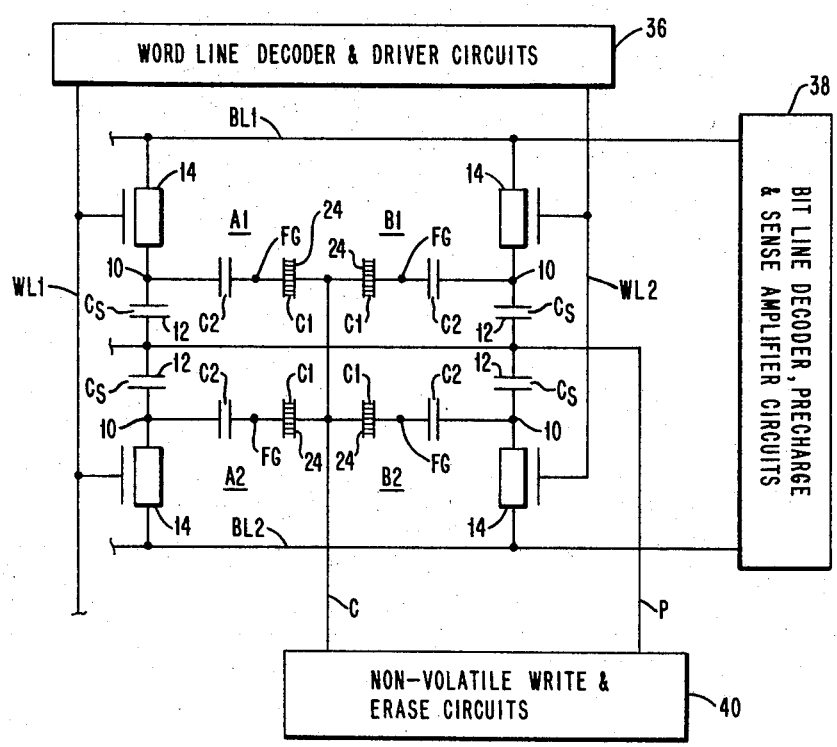
FIG. 3 illustrates a memory system of the present invention having an array of cells each of which may be of the type illustrated in FIG. 2 of the drawings.

FIG. 3 illustrates a 2×2 array of non-volatile memory cells of the type shown in FIGS. 1 and 2 of the drawings wherein similar elements in the two figures are identified by the same reference characters. The array includes a first word line WL1 to which first and second cells A1 and A2 are connected and a second word line WL2 to which a third cell B1 and fourth cell B2 are connected. First and third cells A1 and B1 are connected to a first bit line BL1 and the second and fourth cells A2 and B2 are connected to a second bit line BL2. The first and second word lines WL1 and WL2 are connected to word line decoder and driver circuit 36 which may employ conventional circuitry and the first and second bit lines BL1 and BL2 are connected to bit line decoder, precharge and sense amplifier circuits 38 which may also utilize conventional circuitry. The control terminal or line C and the capacitor plate terminal or line P are connected to non-volatile write and erase circuits 40, which may be of any known type.

Figure 4:
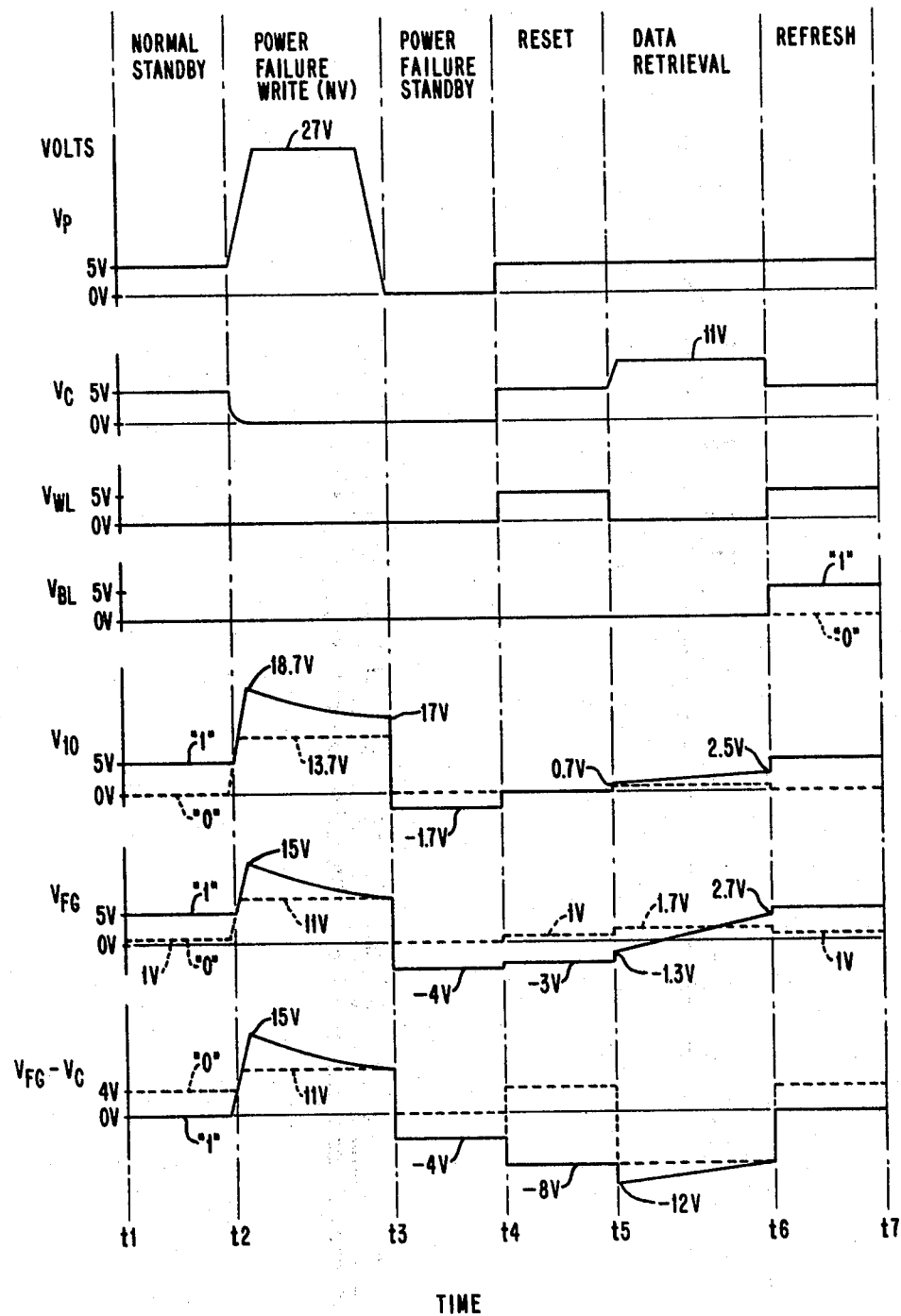
FIG. 4 is an illustrative pulse program which may be used to operate the cell of FIG. 2 and the system illustrated in FIG. 3 of the drawings.

In order to better understand the operation of the non-volatile memory cell illustrated in FIGS. 1 and 2 and also of the system illustrated in FIG. 3 of the drawings reference may be had to an illustrative pulse program indicated in FIG. 4 of the drawings. During normal operation of a non-volatile memory cell illustrated, e.g., a cell A1 in FIG. 3 of the drawings, the cell performs as a conventional one device storage circuit coupled to the first bit line BL1 and the first word line WL1 and the voltages therein may be those indicated in FIG. 4 of the drawing between times t1 and t2, with constant voltages being applied to terminals C and P having a magnitude of, say, +5 volts. For a stored binary bit "0", the voltage on storage node 10 is, say, zero volts and then the voltage on the floating gate FG will be at approximately 1.0 volts. For a stored binary bit "1", both the storage node 10 and the floating gate FG are preferably at +5 volts for illustration purposes. As indicated in FIG. 4 of the drawings, applied voltage $V_{BL}$ on the bit/sense line BL, the resulting voltage $V_{10}$ on the storage node 10, the resulting voltage $V_{FG}$ on the floating gate FG and the resulting voltage $V_{FG}-V_C$ produced across the dual electron injector system or capacitor C1 are shown in solid lines for stored binary "1" bits and in dashed lines for stored binary "0" bits.

When power failure is detected, the voltage on the storage capacitor plate 12 is increased from +5.0 volts to, say, 27.0 volts while the voltage at the control terminal C is reduced from +5.0 volts to, say, 0.0 volts, as indicated in FIG. 4 between times t2 and t3. As a result, for the cell storing a binary bit "1", the storage node voltage $V_{10}$ is increased to about +18.7 volts, the floating gate voltage $V_{FG}$ to about +15.0 volts, and, therefore, the voltage $V_{FG}-V_C$ across the first capacitor C1 is 15.0 volts, sufficient to conduct charging current from floating gate FG to the control terminal C. The result is that the floating gate FG is now negatively charged. In case of a cell storing binary bit "0", the voltage across the first capacitor C1 is only 11.0 volts which is by design not sufficient to significantly alter the charge on the floating gate FG since this voltage is equal to or less then the turn-on voltage of the dual electron injector structure 26. Thus, the floating gate FG of a cell storing a binary "1" is charged to, say, −4.0 volts after a short period of time ranging from nanoseconds to a few milliseconds and after, the voltages are removed from the terminals C and P.

Between times t3 and t4, all applied voltages are at 0.0 volts, and thus for the cell that has a stored binary "0", all voltages are at 0.0 volts at all the nodes. The cell that has stored a binary "1", on the other hand, has −4.0 volts on the floating gate FG, and will, therefore, induce an image charge of −1.7 volts on the storage node 10, if other terminals are at ground or zero potential. The value of the voltage $V_{10}$ on the storage node 10 may differ depending upon the value of the parasitic capacitances in the circuit.

When power is again turned on or resumed, the memory can be used in a volatile mode with new data while still storing the non-volatile data in the floating gates, if desired.

After the resumption of power to reset or write the previously stored information from the floating gate FG back into the volatile circuit and to erase the stored data in the floating gate FG, +5.0 volts is applied to the storage capacitor plate 12 or terminal P and the control terminal C. Next, all storage nodes are reset to 0.0 volts by applying 0.0 volts to all bit lines and 5 volts to all word lines, as is shown in the pulse program between times t4 and t5. It should be noted that the nodal voltages on the cell that initially had stored a binary bit "0" are similar to that between times t1 and t2. For the cell that had stored a binary bit "1", the presence of a fixed charge value of −4.0 volts on the floating gate FG and the existence of 0.0 volts on the storage node 10 alters the voltage on the floating gate FG to −3 volts. As a result, the voltage across the first capacitor C1 is −8.0 volts.

The data retrieval and charge removal or erasure of data from the floating gate FG takes place between times t5 and t6. This is accomplished by pulsing the control terminal C from +5.0 volts to +11.0 volts so that an effective voltage of −12.0 volts appears across the first capacitor C1 of the binary bit "1" cell and −8.0 volts appears across the first capacitor of the binary bit "0" cell. Since −8.0 volts is insufficient, by design, to make the first capacitor or dual electron injector structure 1 conductive, no change occurs for the cell storing the previous binary bit "0". Since −12.0 volts is sufficient to conduct through the first capacitor C1, the floating gate FG of the cell storing the previous binary "1" will lose the −4.0 volt charge, thereby raising the voltage at its storage node 10 from about +0.7 volts to about +2.5 volts.

The voltage on the control terminal C is now returned to +5.0 volts, and the cell is refreshed in its normal manner to restore voltages to the storage nodes 10 having full values representing "1" and "0" binary digits.

It can be seen that the voltage levels between binary "1" and binary "0" cells differ by about 1.7 volts with the transfer ratio between the total storage node capacitance and total bit line and other related circuit capacitance being, say, 0.2, the distinguishing signal between the two values of binary data is 340 millivolts which is a sufficient signal to sense and refresh the data as indicated between times t6 and t7 on the pulse program of FIG. 4.

It should be understood that there are numerous other pulse programs that could be implemented to achieve similar results. For example, rather than applying a positive pulse to the storage capacitor plate P, the control terminal C may be pulsed negatively.

As indicated hereinabove, each of the cells A1, A2, B1 and B2 illustrated in the system illustrated in FIG. 3 of the drawings may be operated in accordance with the illustrative pulse program shown in FIG. 4. As also noted hereinabove, cell A1 is operated by selecting word line WL1 and bit/sense line BL1, while cell A2 is operated by selecting word line WL1 and bit/sense line BL2, cell B1 is operated by selecting word line WL2 and bit/sense line BL1 and cell B2 is operated by selecting word line WL2 and bit/sense line BL2. The voltages $V_C$ and $V_P$ are produced in non-volatile write and erase circuits 40, which may be provided on-chip or by the system using this memory, and are applied to control terminal C and storage capacitor plate terminal P which are common to all cells A1, A2, B1 and B2.

In practice, process tolerances, storage node leakages, and variations in applied voltage result in a worse case binary "1" signal of about 3.5 volts in aggressive designs of dynamic RAM memories. Such a low signal for a binary bit "1" may, under certain conditions, not be strong enough to store data in the non-volatile node on the floating gate FG. This value of signal may be increased by increasing the frequency of the refresh cycles. On the other hand, all the cells may be refreshed within, say, 2 milliseconds prior to the time when the non-volatile writing operation takes place, as indicated in the above cited U.S. Pat. No. 4,175,291. Alternatively, each word line and all bit lines may be held at the normal write mode so that strong signals representing binary "0" and "1" are always present at all the storage nodes of all devices along that word line. The control terminal C and the storage capacitor plate P may now be pulsed to write non-volatilely that particular word line. In this manner all other word lines may be written in the non-volatile mode sequentially.

It is also possible to arrange the storage capacitor plate line or terminal P and control line or terminal C in the same manner as the word line with their own decoder and driver circuits so that only those cells along the energized word line have the write pulses applied to them. In this manner, cells along other word lines are unaffected. Data retrieval, when power resumes, may be carried out as described hereinabove.

This sequential method of storing data in the non-volatile mode requires relatively longer write times and demands the availability of substantial power for a longer period of time and, therefore, may be suitable for small systems that require relatively smaller bytes of non-volatile memory.

Yet another method of solving the low signal problem is to use higher operating voltages. For example, instead of using 5.0 volts to represent binary digit "1", as indicated in FIG. 4, 8.5 volts may be chosen. On data retrieval, the nominal voltage representing binary digit "1" can be shown to be about 3 volts instead of the 1.7 volts for the 5.0 volts case. With the use of higher voltages, more power is required to accomplish the non-volatile write. This method is only suited for systems requiring a small size non-volatile memory.

Figure 5:
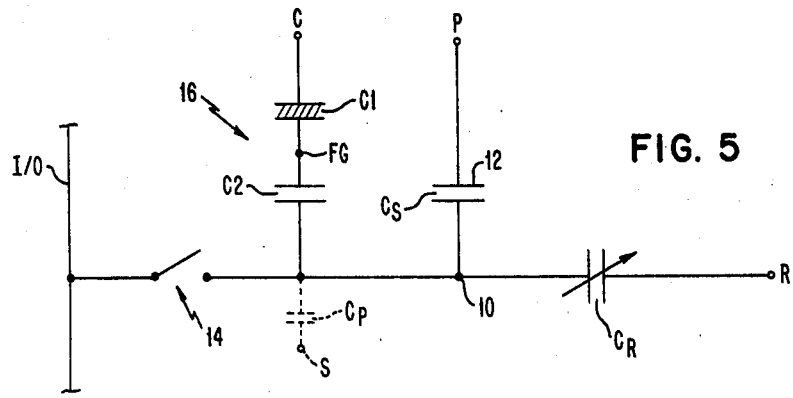
FIG. 5 is a circuit diagram of another embodiment of the non-volatile memory cell of the present invention.
Figure 6:
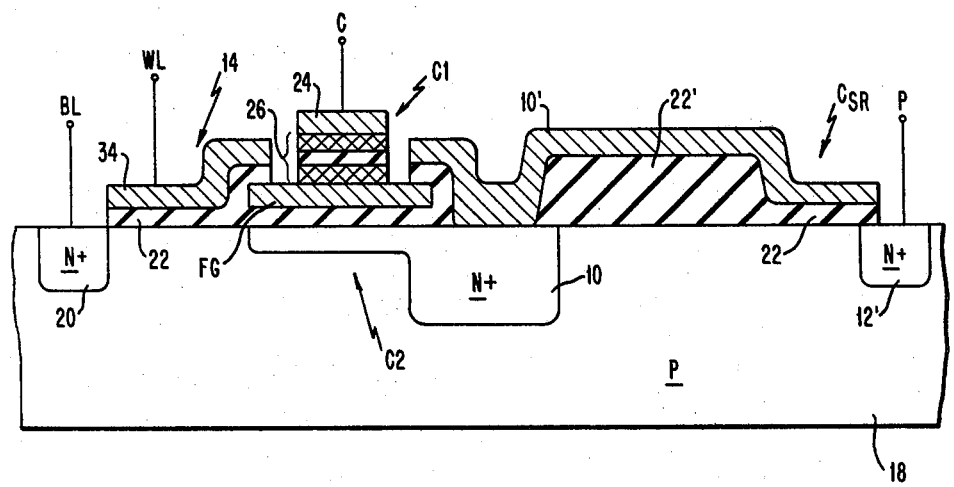
FIG. 6 is a sectional view of yet a further embodiment of the non-volatile memory cell of the present invention.

A preferred way of increasing the signal level for binary digit "1" during non-volatile write operation is to add to the storage node a voltage variable capacitor. This capacitor may be in addition to or in place of the storage capacitor $C_s$, as illustrated in FIGS. 5 and 6 of the drawings. The incorporation of the voltage variable capacitor will, of course, increase the cell area.

FIG. 5 illustrates the embodiment of the invention which includes a circuit similar to that shown in FIG. 1 of the drawings but with a variable capacitor $C_R$ provided between the storage node 10 and a terminal R to which a voltage pulse $V_R$ is selectively applied. The voltage variable capacitor $C_R$ may be of the type disclosed in U.S. Pat. No. 3,900,747, filed on July 12, 1973, by H. Yamazaki and illustrated in FIG. 5 thereof. The other elements in the circuit of FIG. 5 of the drawings of this application are similar to those illustrated in FIG. 1 and are identified by the same reference characters.

FIG. 6 shows a cross-section of a possible embodiment of FIG. 5 where the voltage variable capacitor is of MOS kind.

The cell of FIG. 5 may be operated with the pulse program of FIG. 4 with the addition of a pulse $V_R$ applied to the voltage variable capacitor $C_R$ through terminal R during the non-volatile write period. The voltage variable capacitor $C_R$ at its high value has a larger value than the total storage node capacitor, thus, if the storage node 10 has binary bit "1" stored therein, a large fraction of voltage at the voltage terminal R will appear at the storage node 10. However, if a binary bit "0" is stored in node 10, the voltage variable capacitor $C_R$ has a low value and, therefore, a very small amount of the voltage on terminal R appears at the storage node 10. In this manner, the signal difference between the binary digit "0" and the binary digit "1" is greatly increased during non-volatile writing. Data may then be restored in the manner described hereinabove of course, it is understood that there are other ways of pulsing to give similar results.

This kind of a cell may be used for large systems requiring very large non-volatile memories. Since only a single pulse is required to write all data in the non-volatile mode while the chip is essentially in standby condition with minimal power dissipation, the power concern is eliminated.

A further embodiment of this invention is shown in FIG. 6 wherein there is disclosed a circuit or cell similar to that shown in FIG. 1 of the drawings but which illustrates a voltage variable capacitor $C_{SR}$ substituted for capacitor $C_s$. The voltage variable capacitor $C_{SR}$ includes a third diffusion 12', the thin silicon dioxide layer 22 and a conductive film 10' separated from the P type substrate 18 by the layer 22 and contacting the diffusion storage node 10. A segment of the conductive film 10' is separated from the substrate 18 by a thick oxide 22'. All other elements in FIG. 6 are similar to the elements of FIG. 1 and are identified by the same reference characters.

The cell illustrated in FIG. 6 of the drawing operates in a manner similar to that described hereinabove in connection with the operation of the embodiment illustrated in FIG. 5, except that the terminal P is pulsed appropriately during write/erase or data retrieval for non-volatile data in accordance to the teaching of this invention.

The cells may be fabricated by any known techniques but it is preferred that the floating gate FG be made from a first layer of doped polysilicon and that the storage capacitor plate 12, the first capacitor electrode 24 and the gate electrode 34 of FIG. 2 and the storage node conductive film 10' of FIG. 6 be made from a second layer of doped polysilicon. Also, an N type semiconductor substrate may be used instead of the P type substrate, with the polarity of the voltages being opposite to those used in the illustrative examples mentioned hereinabove.

Although the invention has been described as utilizing a dual electron injector structure in the first capacitor C1, it should be understood that, if desired, a thin dielectric layer may be substituted for the dual electron injector structure and oxide tunneling techniques used to transfer the charge to and from the floating gate FG. With the use of the thin dielectric layer in capacitor C1, higher operating voltages may be required. The relative capacitance values of the various capacitors of the circuits should be maintained in accordance with the teaching of this invention and the pulse program for operating this circuit may be similar to that illustrated in FIG. 4 of the drawings.

It should be understood that the voltages applied to write and erase data from the floating gate FG with the use of the dual electron injector structures are not necessarily symmetrical. This phenomenon has been reported in the above cited article in IEEE Electron Device Letters.

Although the voltages applied to the terminal P are indicated as having a maximum magnitude of +27 volts, it should be understood that voltages of significantly lower values can be used by trading off the insulator thicknesses in capacitors C1, C2 and $C_s$. Small voltage increases across the dual electron injector structure produce sharp drops in writing and erase times because of the exponential nature of the dual electron injector and this insulator structure current-voltage characteristics.

It should be noted that in the interest of clarity, an array having only four cells has been illustrated in FIG. 3 of the drawing, however, in practice hundreds of word lines would be used with each word line having hundreds of cells coupled thereto to provide an array of thousands of cells.

An improved non-volatile dynamic semiconductor memory has been described hereinabove which can operate normally at the high speeds known in random access memories, yet which will not lose its data when a power failure occurs. The cells may retain their seriously stored data in a non-volatile structure while new data is being handled in a volatile storage circuit. Volatile circuit data, from either a field effect transistor or bipolar device circuit, is retained in a non-volatile device with the use of lower voltages dissipating only a very small amount of power and with faster data transfer times from the volatile circuitry to the non-volatile device or structure. Furthermore, the process for making the memory of the present invention is simpler than that used to make, e.g., MNOS devices and the memory of the present invention uses substantially lower writing power levels than is required in floating gate devices written by hot electrons.

While the invention has been particularly shown and described with reference to preferred embodiments thereof, it will be understood by those skilled in the art that various changes in form and details may be made therein without departing from the spirit and scope of the invention.

What is claimed is:

1. A memory cell comprising;
   a storage capacitor having a storage node and a plate,
   means for applying a reference voltage to said plate,
   a control electrode,
   a voltage divider circuit having serially-connected first and second capacitors and a floating gate connected to the common point between said first and second capacitors, said voltage divider circuit being disposed between said control electrode and said storage node,
   an input/output line, and
   a transfer device disposed between said storage node and said input/output line.

2. A memory cell as set forth in claim 1 wherein said first capacitor is disposed between said floating gate and said control electrode and has a capacitance value substantially less than that of said second capacitor.

3. A memory cell as set forth in claim 2 wherein said first capacitor includes a first enhanced conduction insulator.

4. A memory cell as set forth in claim 3 wherein said first capacitor further includes a second enhanced conduction insulator and a given insulating layer disposed between said first and second insulators.

5. A memory cell as set forth in claim 1 wherein said reference voltage applying means applies a first voltage having a given magnitude during one period of time and a second voltage having a magnitude substantially higher than that of said given magnitude during another period of time.

6. A memory cell as set forth in claim 5 wherein said transfer device is a transistor and said input/output line is a bit/sense line.

7. A memory cell as set forth in claim 6 wherein said transistor is a field effect transistor and said first capacitor is disposed between said floating gate and said control electrode and has a capacitance value substantially less than that of said second capacitor.

8. A memory cell as set forth in claim 7 wherein said first capacitor includes a first enhanced conduction insulator.

9. A memory cell as set forth in claim 8 wherein said first capacitor further includes a second enhanced conduction insulator and a given insulating layer disposed between said first and second insulators.

10. A memory cell as set forth in claim 9 further including means for applying a second reference voltage to said control electrode.

11. A memory cell as set forth in claim 10 wherein said second reference voltage applying means applies a first voltage having a given magnitude during said one period of time and a second voltage having a magnitude substantially lower than that of the given magnitude of said second reference voltage during said another period of time.

12. A memory cell as set forth in claim 9 wherein said given insulating layer includes a silicon dioxide layer and each of said first and second enhanced conduction insulators includes a silicon-rich silicon dioxide layer.

13. A non-volatile dynamic random access memory cell comprising;
   a semiconductor substrate,
   a storage capacitor having a plate and a storage node disposed in said substrate,
   means for applying a first reference voltage to said plate, said first reference voltage having a first magnitude during one period of time and a second magnitude substantially greater than said first magnitude during another period of time,
   a control electrode,
   means for applying a second reference voltage to said control electrode, said second reference voltage having a first magnitude during said one period of time and a second magnitude substantially smaller than said first magnitude of said second reference voltage during said another period of time,
   a voltage divider circuit having serially-connected first and second capacitors and a floating gate connected to the common point between said first and second capacitors, said voltage divider being disposed between said control electrode and said storage node,
   a bit/sense line disposed in said substrate, and
   a field effect transistor disposed between said storage node and said bit/sense line.

14. A non-volatile dynamic random access memory cell as set forth in claim 13 wherein said first capacitor is disposed between said floating gate and said control electrode and has a capacitance value substantially less than that of said second capacitor.

15. A non-volatile dynamic random access memory cell as set forth in claim 14 wherein said first capacitor includes an enhanced conduction insulator.

16. A non-volatile dynamic random access memory cell as set forth in claim 14 wherein said first capacitor includes a layer of silicon dioxide and first and second layers of silicon-rich silicon dioxide disposed on opposite sides of said layer of silicon dioxide.

17. A dynamic memory cell comprising;
   a semiconductor substrate,
   a storage capacitor having a capacitor electrode and a storage node disposed in said substrate,
   a control electrode,
   means for applying control voltages between said control electrode and said capacitor electrode,
   a voltage divider circuit having serially-connected first and second capacitors and a floating gate connected to the common point between said first and second capacitors, said voltage divider being disposed between said control electrode and said storage node,
   a bit/sense line, and
   a transfer device disposed between said storage node and said bit/sense line.

18. A dynamic memory cell as set forth in claim 17 wherein said first capacitor includes an enhanced conduction insulator.

19. A dynamic memory cell comprising;
   a semiconductor substrate,
   a storage capacitor having a capacitor electrode and a storage node disposed in said substrate,
   a control electrode,
   means for applying control voltages between said control electrode and said capacitor electrode,
   a floating gate disposed between said control electrode and said storage node,
   an enhanced conduction insulator disposed between said control electrode and said storage node,
   a bit/sense line, and
   a transfer device disposed between said storage node and said bit/sense line.

20. A memory cell comprising;
   a storage capacitor having a storage node and a plate,
   a control electrode,
   a voltage divider circuit having serially-connected first and second capacitors and a floating gate connected to the common point between said first and second capacitors said voltage divider circuit being disposed between said control electrode and said storage node, and
   means for applying control voltages to said control electrode and to said plate.

21. A memory cell as set forth in claim 21 wherein one of said first and second capacitors includes an enhanced conduction insulator.

* * * * *